(12) United States Patent
Lih et al.

(10) Patent No.: US 6,806,638 B2
(45) Date of Patent: Oct. 19, 2004

(54) DISPLAY OF ACTIVE MATRIX ORGANIC LIGHT EMITTING DIODE AND FABRICATING METHOD

(75) Inventors: Jiin-Jou Lih, Taichung (TW); Chih-Feng Sung, Miaoli (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/707,086

(22) Filed: Nov. 20, 2003

(65) Prior Publication Data

US 2004/0124423 A1 Jul. 1, 2004

(30) Foreign Application Priority Data

Dec. 27, 2002 (TW) ........................................ 91137633 A

(51) Int. Cl.7 ............................................. H05B 33/00
(52) U.S. Cl. ...................................... 313/498; 313/512
(58) Field of Search ................................ 313/495, 498, 313/500, 512

(56) References Cited

U.S. PATENT DOCUMENTS 6,623,324 B2 * 9/2003 Tanaka ......................... 445/24
6,628,071 B1 * 9/2003 Su .............................. 313/512

\* cited by examiner

*Primary Examiner*—David Vu
(74) *Attorney, Agent, or Firm*—Jiang Chyun IP Office

(57) ABSTRACT

A method of fabricating an active matrix organic light emitting diode display is described. A substrate having a light-emitting region and a non-light-emitting region thereon is provided, and pixel structures have been formed in the light-emitting region. A driving IC is formed on the substrate in the non-emitting region and electrically coupled with the pixel structures. A packaging cap is disposed over the substrate and adhered to the substrate. The packaging cap covers the emitting region of the substrate and the driving IC remains being exposed. Since the driving IC is exposed from the packaging cap, the driving IC can be tested or repaired directly when the driving IC is abnormal.

14 Claims, 2 Drawing Sheets

DISPLAY OF ACTIVE MATRIX ORGANIC LIGHT EMITTING DIODE AND FABRICATING METHOD

CROSS REFERENCE TO RELATED APPLICATIONS

This application claims the priority benefit of Taiwan application serial no. 91137633, filed Dec. 27, 2002.

BACKGROUND OF INVENTION

1. Field of Invention

The present invention relates to planar display and the fabrication method. More particularly, the present invention relates to a display of active matrix organic light emitting diode (AMOLED) and the fabricating method.

2. Description of Related Art

The organic light emitting diode is a photoelectric device and can convert the electric energy into optical form in high converting efficiency and is usually used in an indicating lamp or a displaying panel. Since the organic light emitting diode has many properties, such as no view angle effect, easy fabrication process, low cost, high response speed, full color capable of operating in a wide temperature range, and satisfying the required characteristics of a display for the multi-media world. In recent years, the organic light emitting diode has been one of the hot research topics.

Currently, the active matrix organic light emitting diode (AMOLED) has been greatly developed, wherein the AMOLED typically includes an organic light emitting layer formed over a substrate having a thin film transistor (TFT) array already formed thereon and a cathode layer. In this manner, the AMOLED is driven by the TFT for emitting the light. The convention fabrication method for the display of AMOLED is as follows.

FIG. 1 is a drawing of top view, schematically illustrating a conventional display of AMOLED. FIG. 2 is a drawing of cross-sectional view, schematically illustrating the structure shown in FIG. 1 along the line I-I'.

Referring to FIG. 1 and FIG. 2, in the conventional fabrication method for the display of AMOLED, a substrate 100 having a light-emitting region 120 and a non-light-emitting region 122 is provided. The light-emitting region 120 of the substrate 100 has already been formed with a number of pixel structures 107 arranged in an array. Each of the pixel structures 107 includes an active device (TFT) and an anode layer 102, a light emitting layer 104, and a cathode layer 106.

In the conventional method, the active device, used to control the pixel structure, is usually composed of TFT's, of which one TFT is used for switching action and another TFT is used for driving action. The TFT can be amorphous silicon TFT or the low temperature polysilicon (LTPS) TFT. Since the technology for the LTPS TFT can form the driving circuit on the substrate 100 at the same time, most of current displays of AMOLED are using the LTPS TFT as the active device for the pixel structure.

In these pixel structures 107, each one of the pixel structures 107 is controlled by a scan line (not shown) and a data line (not shown). The scan line and the data line, located at two sides of the light-emitting region 120, continuously extend into the non-light-emitting region 122, and form a number of fan-out conductive lines 108. The fan-out conductive lines are used for electrical coupling with the driving circuit formed at the non-light-emitting region 122. Further still, the driving circuit 110 is formed on the substrate 100 at the non-light-emitting region 122, wherein the driving circuit 110 is electrically coupled with the pixel structures 107 via the fan-out conductive lines 108. Then, a packaging cap 114 is disposed over the substrate 100 by a sealant (not shown) for adhering together. The packaging cap 114 covers the light-emitting region 120 on the substrate 100 and the region disposed with driving circuit 110, so as to prevent the devices of the display from being under a humid environment and resulting in the malfunction.

However, since the fabrication yield for the LTPS TFT is still low, when the driving circuit 110 is abnormal, it is very inconvenient to perform the test or repair on driving circuit 110, which has been formed inside the packaging cap 114. Indirectly, the production yield is also reduced.

SUMMARY OF INVENTION

The invention provides a display of AMOLED and the fabrication method, so as to at least solve the conventional disadvantages about inconveniently performing the test or repairing on driving circuit, which has been formed inside the packaging cap.

The invention provides a method for fabricating a display of AMOLED. The method includes first providing a substrate, which has a light-emitting region and a non-light-emitting region. Also and, a number of pixel structures are formed in the light-emitting region on the substrate. Each of the pixel structures includes an active device, an anode layer, a light emitting layer and a cathode layer. In the invention, the active device includes at least two amorphous silicon TFT's or at least two LTPS TFT's. A driving circuit is formed in the non-light-emitting region on the substrate, in which the driving circuit and the pixel structures are electrically coupled by a number of conductive lines. Then, a packaging cap is disposed over the substrate by an adhering material, wherein the packaging cap covers the light-emitting region but the driving circuit remains being exposed. In the invention, the packaging cap can be, for example, a metallic packaging cap or a glass packaging cap.

The invention also provides a display structure of AMOLED, including a substrate, a driving circuit, and a packaging cap. The substrate has a light-emitting region and a non-light-emitting region. Also and, a number of pixel structures are disposed in the light-emitting region on the substrate. Each of the pixel structures includes an active device, an anode layer, a light emitting layer and a cathode layer. In the invention, the active device includes at least two amorphous silicon TFTs or at least two LTPS TFTs. Also and, a driving circuit is formed in the non-light-emitting region on the substrate, in which the driving circuit and the pixel structures are electrically coupled by a number of conductive lines. Then, a packaging cap is disposed over the substrate and is affixed onto the substrate by adhering, wherein the packaging cap covers the light-emitting region but the driving circuit remains being exposed. In the invention, the packaging cap can be, for example, a metallic packaging cap or a glass packaging cap.

Since the packaging cap of the AMOLED display in the invention does not cover the driving circuit, when the malfunction occurs on the driving circuit, the test or the repairing on the driving circuit can therefore be directly performed.

Since the packaging cap of the AMOLED display in the invention does not cover the driving circuit, the size of the packaging cap can be less than the size of the conventional packaging cap. As a result, the mechanical strength of the packaging cap is improved and diffusion path or area, where the humid air can diffuse into, is relatively smaller.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
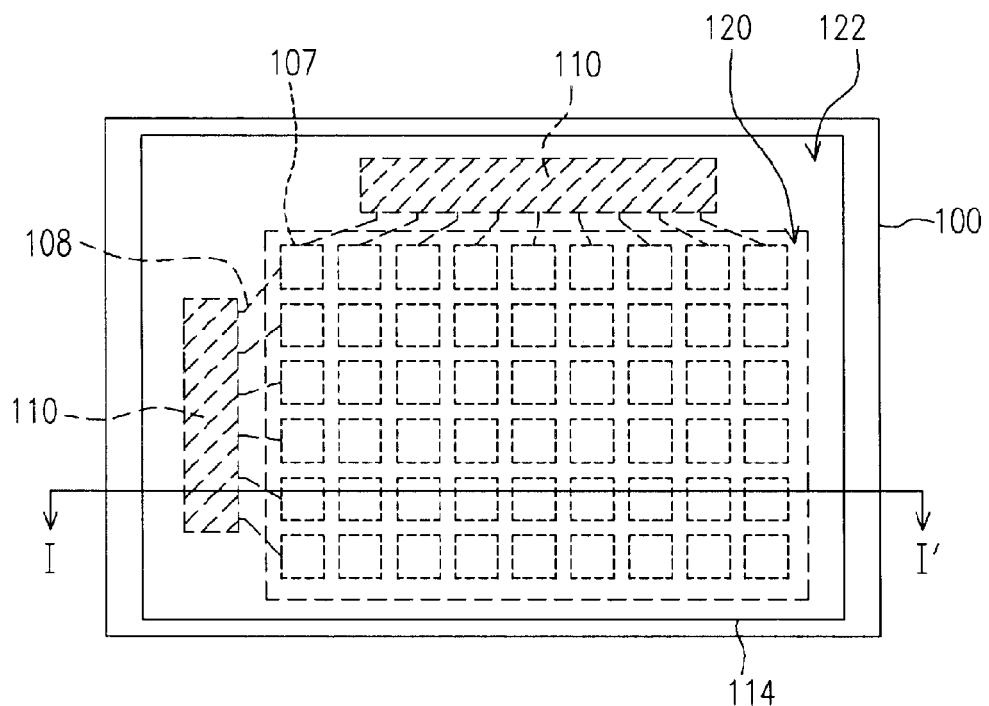
FIG. 1 is a drawing of top view, schematically illustrating a conventional display of AMOLED.
Figure 2:
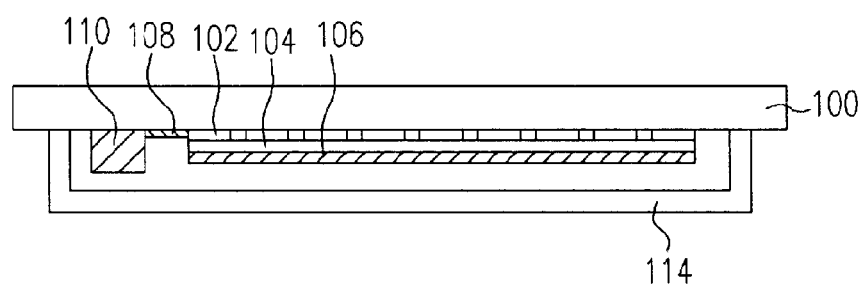
FIG. 2 is a drawing of cross-sectional view, schematically illustrating the structure shown in FIG. 1 along the line I-I'.
Figure 3:
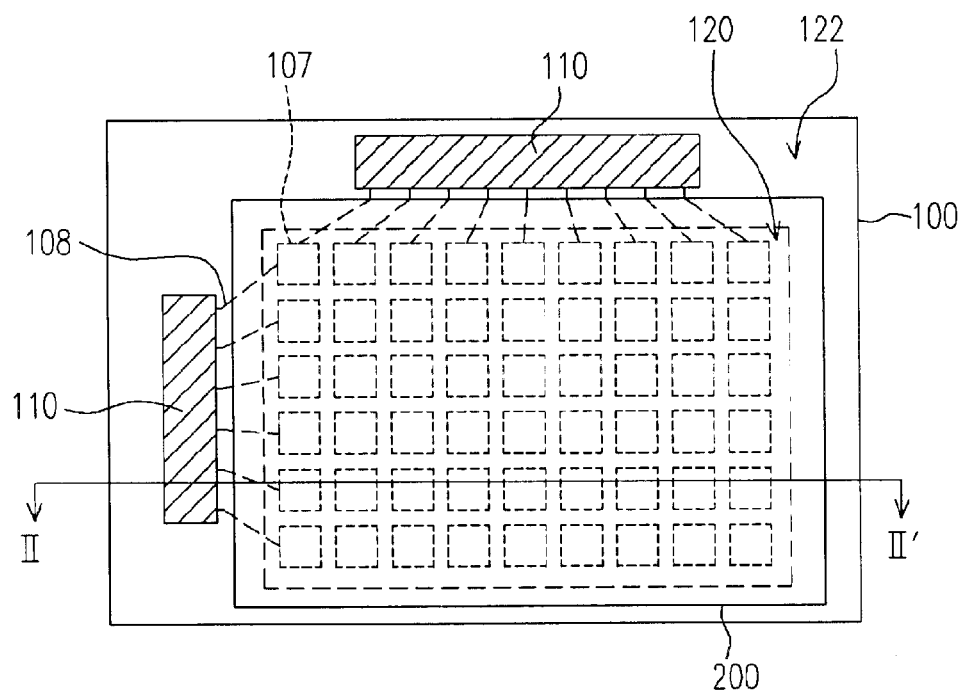
FIG. 3 is a drawing of top view, schematically illustrating a display of AMOLED, according to a first preferred embodiment of this invention.
Figure 4:
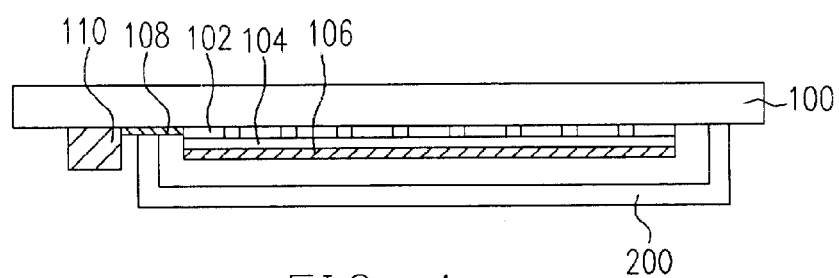
FIG. 4 is a drawing of cross-sectional view, schematically illustrating the structure shown in FIG. 3 along the line II-II'.

FIG. 3 is a drawing of top view, schematically illustrating a display of AMOLED, according to a first preferred embodiment of this invention; and FIG. 4 is a drawing of cross-sectional view, schematically illustrating the structure shown in FIG. 3 along the line II-II'.

Referring to FIG. 3 and FIG. 4, in the method of the invention to fabricate the display of AMOLED, a substrate 100 is provided. The substrate 100 has a light-emitting region 120 and a non-light-emitting region 122. The light-emitting region 120 of the substrate 100 has already been formed with a number of pixel structures 107 arranged in an array. Each of the pixel structures 107 includes an active device (TFT) and an anode layer 102, a light emitting layer 104, and a cathode layer 106.

Here, the active device of the pixel structure 107 includes at least two TFTs. In the embodiment, the active device, for example, is composed of two TFTs, of which one TFT is used for switching action and another TFT is used for driving action. The TFTs can be amorphous silicon TFTs or the low temperature polysilicon (LTPS) TFTs. In addition, in the pixel structures 107, each one of the pixel structures 107 is controlled by a scan line (not shown) and a data line (not shown). The scan line and the data line, located at two sides of the light-emitting region 120, continuously extend into the non-light-emitting region 122, and form a number of fan-out conductive lines 108. The fan-out conductive lines 108 are used for electrical coupling with the driving circuit formed at the non-light-emitting region 122.

In addition, the non-light-emitting region 122 on the substrate 100 has a driving circuit 110 formed thereon, wherein the driving circuit 110 is electrically coupled with the pixel structures 107 via the fan-out conductive lines 108.

It should be noted that when the pixel structures 107 are formed using the LTPS TFTs as the active device, the driving circuit 110 and the active device of the pixel structures 107 can be formed on the substrate 100 using the same fabrication process. In other words, the driving circuit can be composed of the TFTs.

However, with respect to the display of AMOLED in high resolution and operated in ultrahigh frequency, the driving circuit 110 may not be achieved only by using the LTPS TFTs. Instead, a semiconductor circuit using the single crystal silicon is necessary to be used. In this manner, some part of the devices, not being affected by the frequency, can be directly formed on the substrate 100. Then, an electric coupling member, which is usually not affected by the frequency, can be used to connect to an external circuit (a semiconductor circuit using the single crystal silicon) for providing the high frequency signals. The driving circuit 110 is thereby formed.

After then, a packaging cap 200 is disposed on the substrate 100. The packaging cap 200 is, for example, affixed to the substrate 100 by a sealant (not shown) for adhering to the substrate 100. The packaging cap 200 covers the light-emitting region 120, and allows the driving circuit 110 on the substrate 100 to be exposed. Here, the packaging cap 200 can be, for example, a metallic packaging cap or a glass packaging cap.

The display of AMOLED in the invention includes a substrate 100, a driving circuit 110, and a packaging cap 200.

The substrate 100 has a light-emitting region 120 and a non-light-emitting region 122. The light-emitting region 120 of the substrate 100 has already been formed with a number of pixel structures 107 arranged in an array. Each of the pixel structures 107 includes an active device (TFT) and an anode layer 102, a light emitting layer 104, and a cathode layer 106. In the invention, the active device includes, for example, at least two amorphous silicon TFTs or at least two LTPS TFTs.

In addition, the driving circuit 110 is disposed on the substrate 100 in the non-light-emitting region 122, wherein the driving circuit 110 and the pixel structures 107 are electrically coupled together via a number of conductive lines 108. The driving circuit 110 is, for example, composed of a number of TFTs or is composed of TFTs and a semiconductor circuit with single crystal silicon.

Furthermore, the packaging cap 200 is disposed above the substrate 100 and is adhered to the substrate 100, wherein the packaging cap 200 covers substrate 100 at the light emitting region 120 but leaves the driving circuit 110 being exposed. In the invention, the packaging cap 200 can be, for example, a metallic packaging cap or a glass packaging cap.

In the invention, the driving circuit 110 is not covered by the packaging cap 200. In other words, the driving circuit 110 is formed outside from the packaging cap 200. When a malfunction occurs on the driving circuit 110, the driving circuit 110 can be directly tested or repaired, so as to improve the product yield.

Particularly, when the display of AMOLED is operated in high resolution and in ultrahigh frequency, the driving circuit 110 may not be achieved only using the LTPS TFTs. In this situation, some part of the devices, not being affected by the frequency, can be directly formed on the substrate 100. An external circuit (a semiconductor circuit using the single crystal silicon) connected to the part of the devices is used to provide the high frequency signals. The driving circuit 110 is thereby formed. Since the semiconductor circuit using the single crystal silicon cannot be directly formed on the substrate 100, it is necessary to be formed outside from the packaging cap 200. Therefore, if the device not being affected by the frequency and the semiconductor circuit using the single crystal silicon, which form the complete driving circuit 110, are all disposed outside the packaging cap 200, the signal decay between the two kinds of circuits can be reduced. As a result, it is the optimized choice that both the two kinds of circuits are disposed outside the packaging cap 200.

In addition, the packaging cap 200 of the AMOLED display in the invention is only covering the light-emitting region 120 on the substrate 100 but not covering the driving circuit 110 on the substrate 100. In this manner, the size of the packaging cap 200 is less than the size of the conventional packaging cap. The reduced size of the packaging cap 200 has at least two advantages. One is that the packaging cap 200 by smaller size has higher mechanical strength, so that it can more effectively protect the internal device from being damaged by the external impact force. Another one is that the packaging cap 200 by smaller size has the smaller area being adhered to the substrate 100, resulting in reducing the diffusion path or diffusion area, where the humid air may be diffused into.

In conclusions, the invention includes several advantages as follows: 1. For the display of AMOLED of the invention, since the packaging cap does not cover the driving circuit, when a malfunction or abnormal situation occurs on the driving circuit, the driving circuit can be directly tested or repaired. 2. For the display of AMOLED of the invention, since the packaging cap covers the light-emitting region but not covers the driving circuit, the size of the packaging cap is less than the size of a conventional packaging cap. The mechanical strength is relative higher and the diffusion path or area by the humid air into the cap is also reduced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming a display of active matrix organic light emitting diode (AMOLED), comprising:

providing a substrate having a light-emitting region and a non-light-emitting region, wherein the light-emitting region of the substrate has a plurality of pixel structures formed thereon;

forming a driving circuit on the substrate in the non-light-emitting region, wherein the driving circuit is electrically coupled with the pixel structures; and adhering a packaging cap on the substrate, wherein the packaging cap covers the light-emitting region but the driving circuit remains being exposed.

2. The method of claim 1, wherein the packaging cap comprises a metallic packaging cap or a glass packaging cap.

3. The method of claim 1, wherein each of the pixel structures comprises an active device with an anode layer, a light-emitting layer, and a cathode layer.

4. The method of claim 3, wherein the active device comprises being formed with at least two amorphous silicon thin film transistors or at least two low temperature polysilicon thin film transistors.

5. The method of claim 1, wherein the driving circuit comprises a plurality of thin film transistors.

6. The method of claim 1, wherein the driving circuit comprises a plurality of thin film transistors and a single-crystal silicon semiconductor circuit.

7. The method of claim 1, in the step of forming the driving circuit further comprising forming a plurality of conductive lines to electrically couple the driving circuit and the pixel structures.

8. A display structure of active matrix organic light emitting diode (AMOLED), the display structure comprising:

a substrate having a light-emitting region and a non-light-emitting region, wherein the light-emitting region of the substrate has a plurality of pixel structures formed thereon;

a driving circuit, disposed on the substrate in the non-light-emitting region, wherein the driving circuit is electrically coupled with the pixel structures; and a packaging cap, adhered on the substrate, wherein the packaging cap covers the light-emitting region but the driving circuit remains being exposed.

9. The display structure of claim 8, wherein the packaging cap comprises a metallic packaging cap or a glass packaging cap.

10. The display structure of claim 8, wherein each of the pixel structures comprises an active device with an anode layer, a light-emitting layer, and a cathode layer.

11. The display structure of claim 8, wherein the active device comprises at least two amorphous silicon thin film transistors or at least two low temperature polysilicon thin film transistors.

12. The display structure of claim 8, wherein the driving circuit comprises a plurality of thin film transistors.

13. The display structure of claim 8, wherein the driving circuit comprises a plurality of thin film transistors and a single-crystal silicon semiconductor circuit.

14. The display structure of claim 8, further comprising a plurality of conductive lines electrical coupled between the driving circuit and the pixel structures.

* * * * *